(12) United States Patent
Takezawa et al.

(10) Patent No.: US 7,701,068 B2
(45) Date of Patent: Apr. 20, 2010

(54) MULTI-CHIP PACKAGE

(75) Inventors: Yoshinori Takezawa, Gifu (JP);
Kazuhiro Hasegawa, Gifu (JP);
Takahiro Asano, Gifu (JP); Takashi Nakata, Gifu (JP)

(73) Assignee: SANYO Electric Co., Ltd., Osaka (JP)

( * ) Notice: Subject to any disclaimer, the term of this patent is extended or adjusted under 35 U.S.C. 154(b) by 144 days.

(21) Appl. No.: 11/713,798

(22) Filed: Mar. 5, 2007

(65) Prior Publication Data
US 2007/0210456 A1 Sep. 13, 2007

(30) Foreign Application Priority Data
Mar. 6, 2006 (JP) .............................. 2006-059772

(51) Int. Cl.
*H01L 23/02* (2006.01)
*H01L 23/48* (2006.01)
*H01L 23/52* (2006.01)
*H01L 29/40* (2006.01)

(52) U.S. Cl. ........................ 257/777; 257/686; 257/723; 257/E21.499

(58) Field of Classification Search .................. 257/690, 257/777, 686, 723–725, E21.499
See application file for complete search history.

(56) References Cited

U.S. PATENT DOCUMENTS

| 6,255,736 | B1 | 7/2001 | Kaneko | |
|---|---|---|---|---|
| 2005/0127526 | A1* | 6/2005 | Saeki et al. | 257/777 |
| 2006/0138624 | A1* | 6/2006 | Kwon et al. | 257/678 |
| 2007/0090507 | A1* | 4/2007 | Lin et al. | 257/686 |
| 2007/0090508 | A1* | 4/2007 | Lin et al. | 257/686 |

FOREIGN PATENT DOCUMENTS

JP 2002-100729 4/2002
JP 2004-363187 12/2004

* cited by examiner

*Primary Examiner*—Howard Weiss
*Assistant Examiner*—Tifney L Skyles
(74) *Attorney, Agent, or Firm*—Morrison & Foerster LLP

(57) ABSTRACT

A multi-chip package suppresses a change, which is caused by packaging, of a circuit characteristic of an analog circuit of which characteristic is adjusted by a nonvolatile register. A digital circuit and an analog circuit are formed on a semiconductor chip. A nonvolatile register is also formed on the semiconductor chip to store information to adjust a circuit characteristic of the analog circuit. The circuit characteristic of the analog circuit is adjusted according to the information stored in this nonvolatile register. Then, another dummy semiconductor chip is attached with an adhesive being superimposed on a circuit area of the analog circuit to build a multi-chip package.

10 Claims, 4 Drawing Sheets

MULTI-CHIP PACKAGE

CROSS-REFERENCE OF THE INVENTION

This invention claims priority from Japanese Patent Application No. 2006-059772, the content of which is incorporated herein by reference in its entirety.

BACKGROUND OF THE INVENTION

1. Field of the Invention

The present invention relates to stabilization of a characteristic of an analog circuit formed on a semiconductor chip.

2. Description of the Related Art

Presently, a semiconductor chip is composed of an analog circuit and a digital circuit in most cases. An analog circuit is a generic name of a circuit that uses a signal of an analog value as data and, for instance, includes a standard voltage generation circuit, a phase locked loop (PLL), an analog-digital converter circuit, a digital-analog converter circuit, a phase comparison circuit, etc. A digital circuit is a generic name of a circuit that uses a signal of a digital value as data and includes an arithmetic circuit, which is composed of various logical circuits, and memories.

Generally, a digital circuit is immune to noise as the circuit handles digital signals, and processes at high speed and is low power consumption as the circuit can be operated by faint signals. On the other hand, an analog circuit is a circuit of which an operational characteristic is volatile due to power-supply voltage, temperature and manufacturing variations as the analog circuit handles analog signals. Therefore, a characteristic of an analog circuit may be adjusted by a nonvolatile register composed of a fuse circuit and EEPROM.

FIG. 1 shows a plan view of a conventional semiconductor chip package, and FIG. 2 shows a cross sectional view of a semiconductor chip package taken along the line C-C of FIG. 1. A digital circuit 102 and an analog circuit 103 are formed on a semiconductor chip 101. A nonvolatile register 104 is also formed on the semiconductor chip 101 to store information to adjust a circuit characteristic of the analog circuit 103. The circuit characteristic of the analog circuit 103 is adjusted according to the information stored in this nonvolatile register 104. The digital circuit 102, the analog circuit 103 and the nonvolatile register 104 are coated with insulation film.

The semiconductor chip 101 also has a pad 107 to transfer signals between these digital circuit 102 and analog circuit 103, and the outside of the semiconductor chip on the periphery. The pad 107 is an electrode that bonds a wire 109 to a lead frame 108 (not shown in FIG. 1).

FIG. 3 is an exemplification of the analog circuit 103 and the nonvolatile register 104 of the semiconductor chip 101. In the analog circuit 103, a voltage Vin generated by a bandgap reference circuit (BGR) 111 is input to a plus input terminal of an operational amplifier 112, and an output voltage Vout is output from the operational amplifier 112. Resistances R1, R2, R3, R4 and R5 are connected in series between the output voltage Vout and a ground voltage GND. A terminal voltage between the resistance R1 and the resistance R2 is input to a minus input terminal of the operational amplifier 112 through a switch S1. In a similar way, a terminal voltage between the resistance R2 and the resistance R3, a terminal voltage between the resistance R3 and the resistance R4 and a terminal voltage between the resistance R4 and the resistance R5 are input to the minus input terminal of the operational amplifier 112 through switches S2, S3 and S4 respectively. Only one of the switches S1, S2, S3 and S4 is turned on and three other switches are turned off according to the information stored in the nonvolatile register 104.

Here, the formula, Rtotal=R1+R2+R3+R4+R5, is used. For instance, when the switch S1 is turned on, an output voltage will be Vout=Vin×Rtotal/(R2+R3+R4+R5). In a similar way, when the switch S2 is turned on, an output voltage will be Vout=Vin×Rtotal/(R3+R4+R5). When the switch S3 is turned on, an output voltage will be Vout=Vin×Rtotal/(R4+R5). When the switch S4 is turned on, an output voltage will be Vout=Vin×Rtotal/(R5). Thus, the output voltage Vout, which is the circuit characteristic of the analog circuit 103, is adjusted by selecting which one of the switches S1, S2, S3 and S4 to be turned on.

The nonvolatile register 104 is composed of a fuse circuit that stores information depending on the presence or absence of cuttings of fuse element by laser irradiation and a part that stores information in a nonvolatile memory such as EEPROM. The nonvolatile register 104 outputs a signal that turns on only one of the switches S1, S2, S3 and S4 according to the information stored.

In a production process of the semiconductor chip 101 exemplified in FIG. 1, it is appropriate to screen defects in the circuit characteristic of the analog circuit 103 at the early stage. Then, it is judged whether the circuit characteristic of the analog circuit 103 is in an allowable range depending on the information stored in the nonvolatile register 104 at the stage of a so-called wafer sort with the semiconductor chip 101 formed on a wafer.

However, it is found that the circuit characteristic adjusted at the stage of wafer sort changes when the semiconductor chip 101 of which the circuit characteristic of the analog circuit 103 is adjusted at the stage of the wafer sort as stated above is packaged and sealed with mold resin.

This invention is achieved in view of the above situation and intends to appropriately suppress a change, which is caused by packaging, of a circuit characteristic of an analog circuit of which characteristic is adjusted by a nonvolatile register.

In addition, this invention also intends to appropriately suppress a change, which is caused by packaging, of a circuit characteristic of an analog circuit even in the case that a circuit characteristic of an analog circuit is not adjusted according to information stored in a nonvolatile register.

SUMMARY OF THE INVENTION

The present invention is a multi-chip package comprising: a first semiconductor chip which a nonvolatile register and an analog circuit area of which a characteristic is adjusted by the nonvolatile register are formed; and a second semiconductor chip which is superimposed on and attached to the analog circuit area with an adhesive.

Moreover, the present invention is a multi-chip package comprising: a first semiconductor chip which an analog circuit area is formed; and a second semiconductor chip which is a dummy chip superimposed on and attached to the analog circuit area with an adhesive.

DETAILED DESCRIPTION OF THE INVENTION

Figure 4:
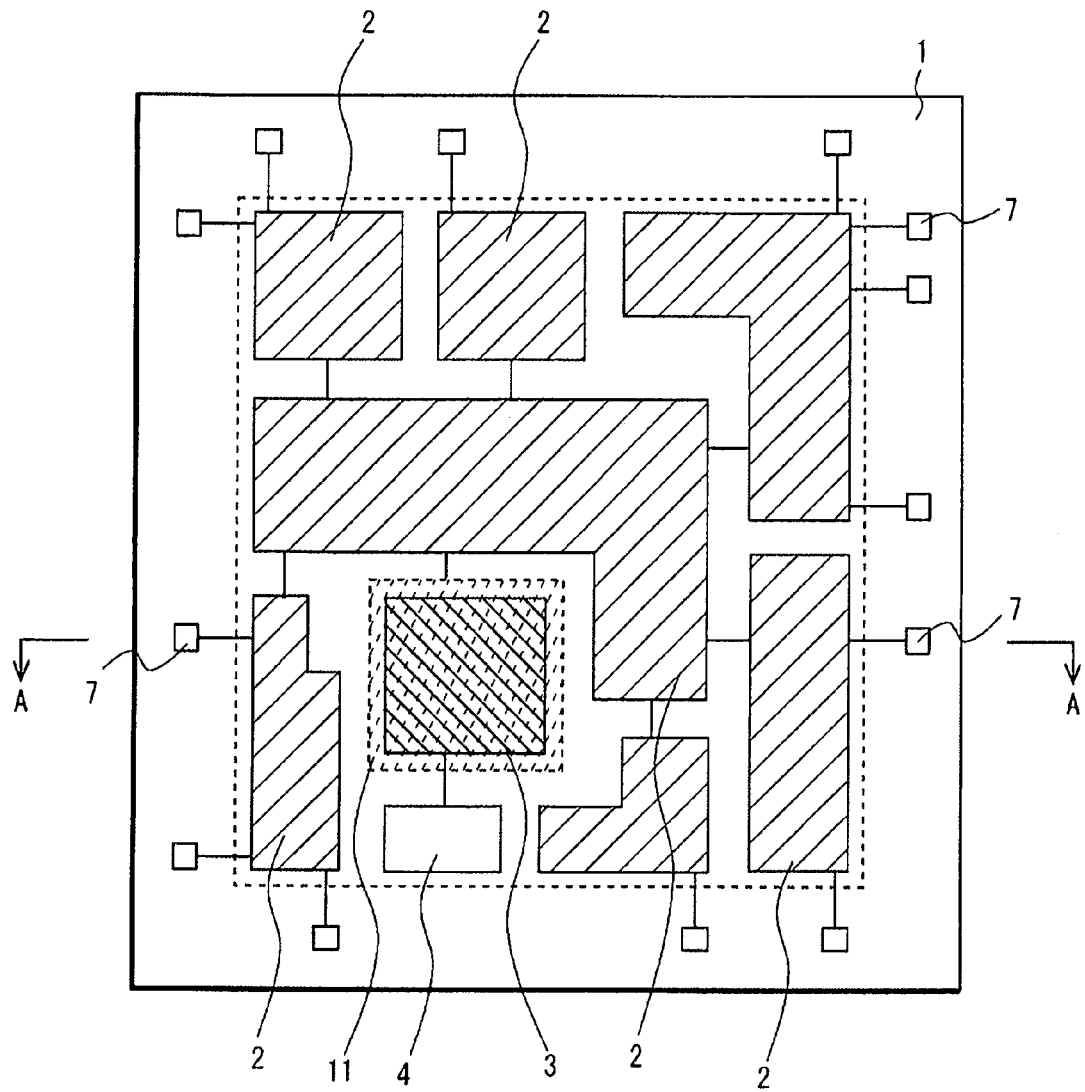
FIG. 4 is a plan view of a first embodiment of a chip package according to the present invention.
Figure 5:
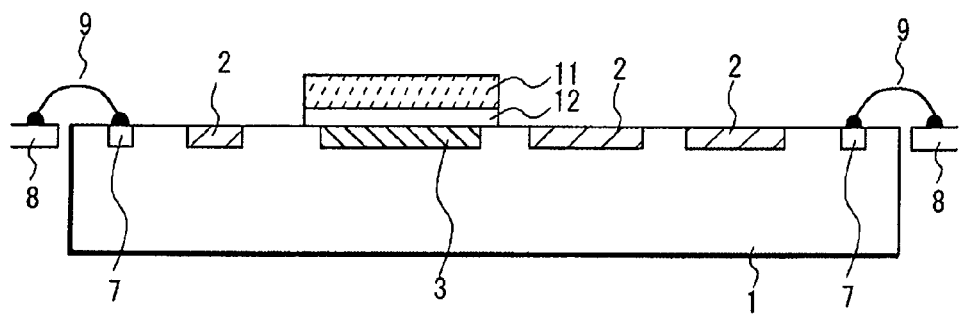
FIG. 5 is a cross sectional view of an embodiment of the present invention taken along the line A-A of FIG. 4.

FIG. 4 shows a plan view of a semiconductor multi-chip package according to a first embodiment of the present invention and FIG. 5 shows a cross sectional view of a semiconductor multi-chip package taken along the line A-A of FIG. 4. A digital circuit 2 and an analog circuit 3 are formed on a semiconductor chip 1. A nonvolatile register 4 is also formed on the semiconductor chip 1 to store information to adjust a circuit characteristic of the analog circuit 3. The circuit characteristic of the analog circuit 3 is adjusted according to the information stored in this nonvolatile register 4. The digital circuit 2, the analog circuit 3 and the nonvolatile register 4 are coated with insulation film.

This embodiment of the invention is characterized by a multi-chip package where another dummy semiconductor chip 11 is attached with an adhesive 12 being superimposed on a circuit area of the analog circuit 3 whose the circuit characteristic is adjusted by a nonvolatile register. The dummy semiconductor chip 11 is placed on the circuit area of the analog circuit 3 of the semiconductor chip 1 with the adhesive 12 such as a die attach tape to be placed on the reverse. Additionally, the adhesive 12 could be nonconductive paste such as epoxy resin.

Figure 1:
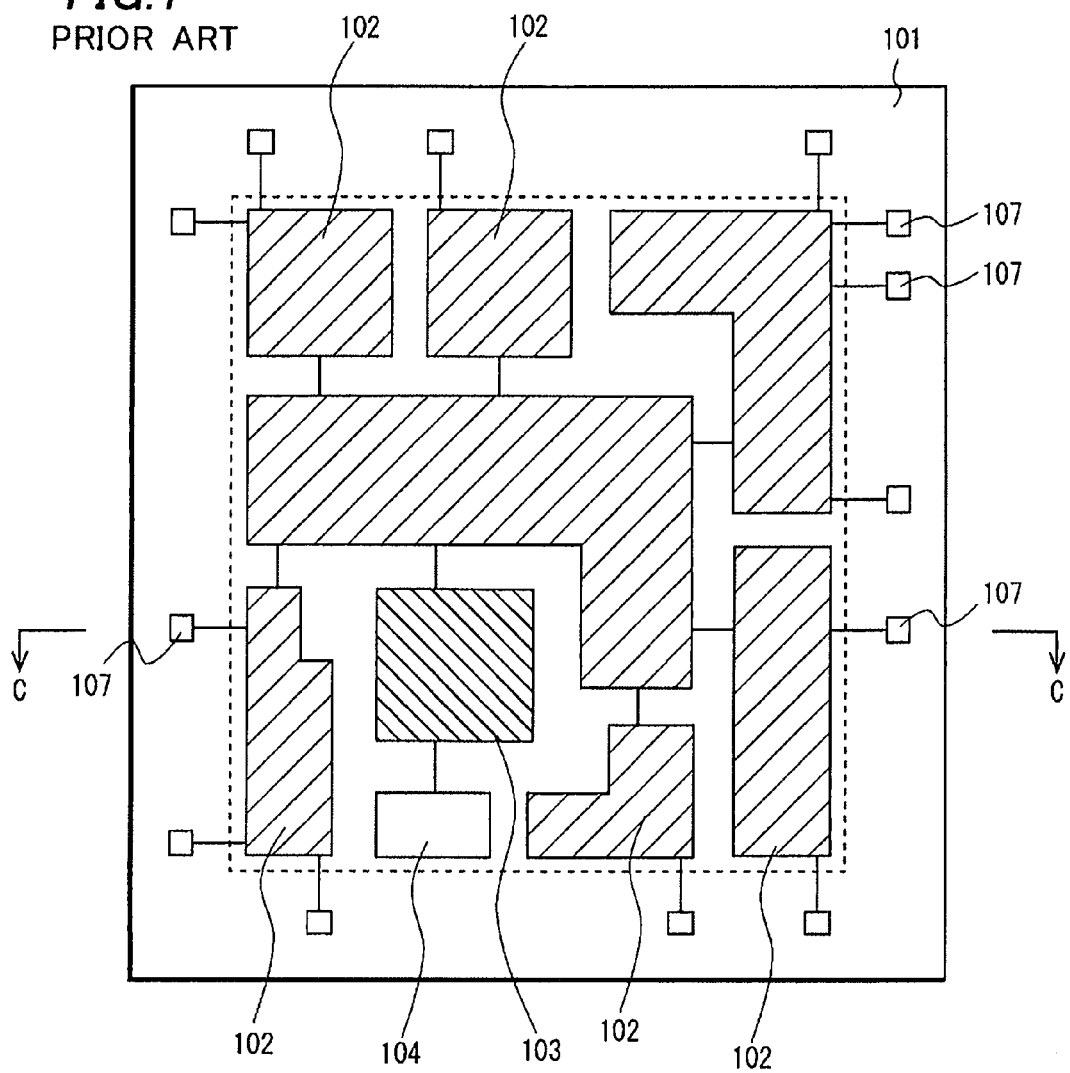
FIG. 1 is a plan view of a conventional semiconductor chip package.
Figure 2:
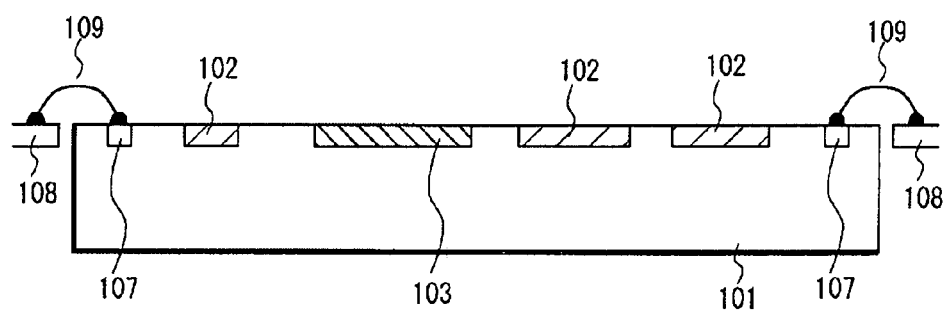
FIG. 2 is a cross sectional view of a semiconductor chip package taken along the line C-C of FIG. 1.
Figure 3:
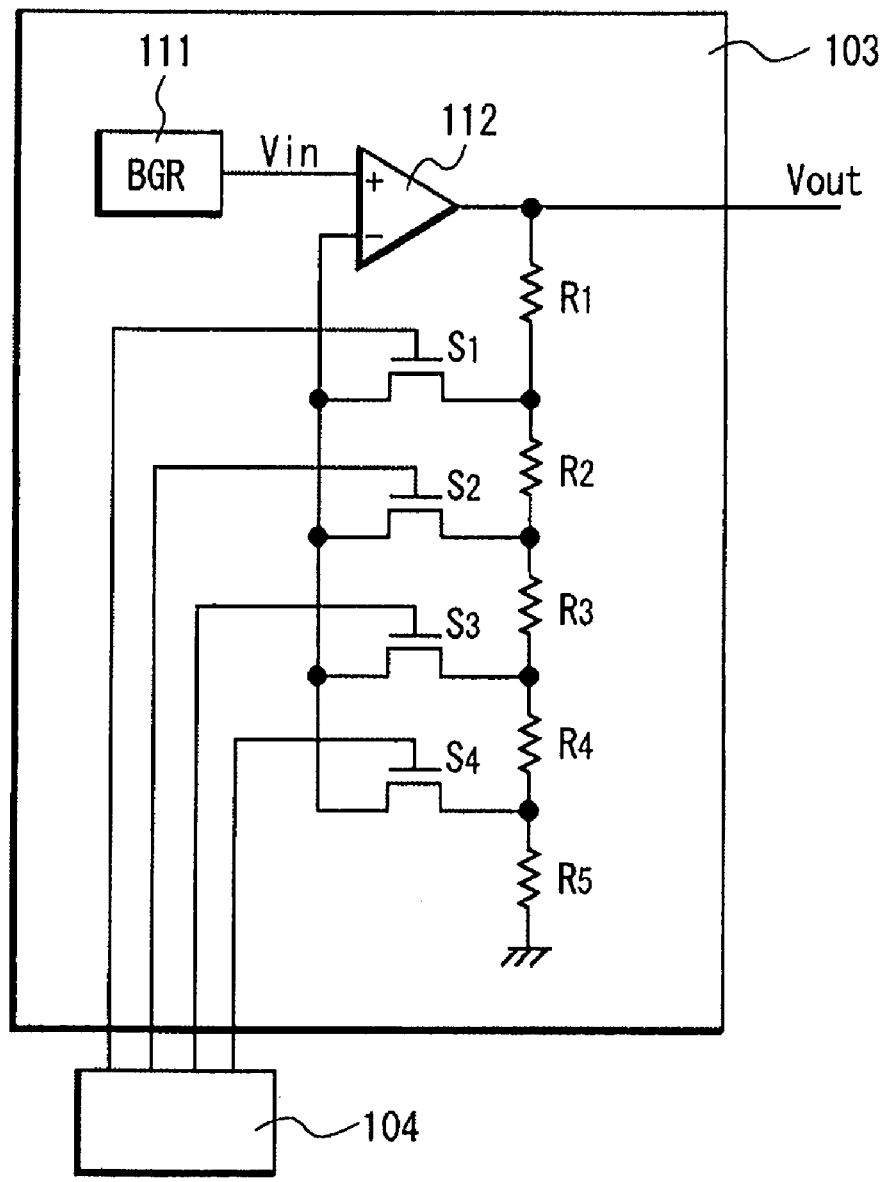
FIG. 3 is an example of an analog circuit and a nonvolatile register of a semiconductor chip.

The semiconductor chip 1 has a pad 7 to transfer signals between these digital circuit 2 and analog circuit 3, and the outside of the semiconductor chip 1 on the periphery. The pad 7 is an electrode that bonds a wire 9 to a lead frame 8 (not shown in FIG. 4). The analog circuit 3 and the nonvolatile register 4 of the semiconductor chip 1 are the same as those shown in FIG. 3. Then, the semiconductor chip 1 and the semiconductor dummy chip 11 are sealed with mold resin to build a multi-chip package.

A change, caused by packaging, of the circuit characteristic of the analog circuit 3, which is adjusted by the nonvolatile register can be appropriately suppressed by having a structure of this multi-chip package. One of the reasons is that a stress on a surface of the circuit area of the analog circuit 3 caused by sealing with mold resin is eased.

In addition, it is appropriate for the adhesive 12 not to contain filler. This is because the filler on the area of the analog circuit 3 locally influences the stress to the analog circuit 3 if the adhesive 12 contains filler.

Figure 6:
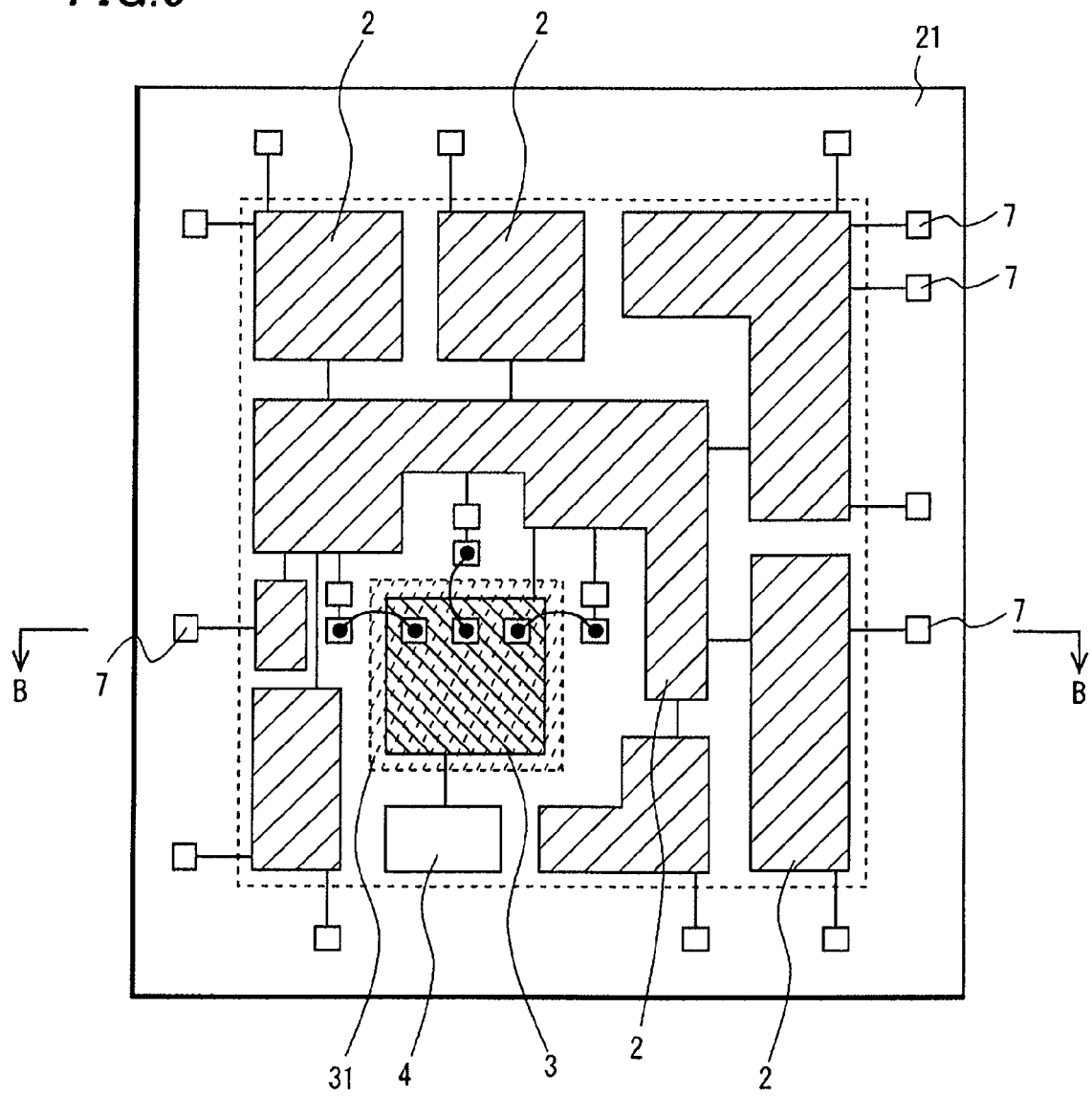
FIG. 6 is a plan view of a second embodiment of a chip package according to the present invention.
Figure 7:
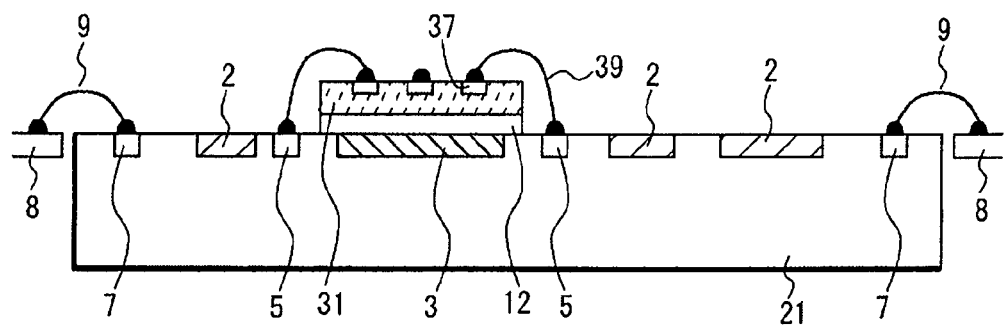
FIG. 7 is a cross sectional view of an embodiment of the present invention taken along the line B-B of FIG. 6.

FIG. 6 shows a plan view of a semiconductor multi-chip package according to a second embodiment of this invention, and FIG. 7 shows a cross sectional view of a semiconductor multi-chip package taken along the line B-B of FIG. 6. The configuration, which is the same as the first embodiment, is numbered using the same numbers and the description is omitted.

The difference between the first embodiment and the second embodiment is that a chip placed on the circuit area of the analog circuit 3 of a semiconductor chip 21 is not the dummy semiconductor chip 11 but a semiconductor chip 31. The circuit area is formed on the semiconductor chip 31. A semiconductor integrated circuit chip composed of various memory chips, such as DRAM and SRAM, and various operational circuits is considered as an example of the semiconductor chip 31. A circuit on the semiconductor chip 31 and a circuit on the semiconductor chip 21 are connected electrically by bonding a pad 37 on the semiconductor chip 31 and a pad 5 on the semiconductor chip 21 with a wire 39.

As a result, a change, which is caused by packaging, of the circuit characteristic of the analog circuit 3 which is adjusted by the nonvolatile register can be appropriately suppressed and the integration of the circuit as a whole multi-chip package can also be increased in this embodiment. This is because a stacked chip within the multi-chip package can be effectively used as a circuit area.

In addition, it is appropriate that the dummy semiconductor chip 11 and the semiconductor chip 1 of the first embodiment are composed of a substrate having the same material composition, for instance, silicon substrate, and in the similar way, it is appropriate that the semiconductor chip 31 and the semiconductor chip 21 of the second embodiment are composed of a substrate using the same material composition. This is because a stress on a surface of the circuit area of the analog circuit 3 caused by sealing with mold resin is eased when a semiconductor chip to be stacked uses a substrate of the same material composition.

According to the above embodiment, the change, which is caused by packaging, of the circuit characteristic of the analog circuit 3 which is adjusted by the nonvolatile register can be appropriately suppressed. However, the embodiment is not limited to this. For instance, a change, which is caused by packaging, of a circuit characteristic of an analog circuit can be appropriately suppressed by attaching another dummy semiconductor chip 11 with the adhesive 12 being superimposed on the circuit area of the analog circuit even if the circuit characteristic of an analog circuit is not adjusted according to information stored in a nonvolatile register.

What is claimed is:

1. A multi-chip package comprising:
   a first semiconductor chip;
   an analog circuit formed on the first semiconductor chip;
   a digital circuit formed on the first semiconductor chip;
   a nonvolatile register formed on the first semiconductor chip and adjusting the analog circuit; and
   a second semiconductor chip attached to the first semiconductor chip with an adhesive so as to cover the analog circuit completely and not to cover part of the digital circuit.

2. The multi-chip package of claim 1, wherein the second semiconductor chip comprises a substrate having the same material composition as the first semiconductor chip.

3. The multi-chip package of claim 1, wherein the second semiconductor chip comprises a dummy chip.

4. The multi-chip package of claim 3, wherein the second semiconductor chip comprises a substrate having the same material composition as the first semiconductor chip.

5. The multi-chip package of claim 1, further comprising another circuit formed on a surface of the second semiconductor chip.

6. The multi-chip package of claim 5, wherein the second semiconductor chip comprises a substrate having the same material composition as the first semiconductor chip.

7. A multi-chip package comprising:
   a first semiconductor chip;
   an analog circuit formed on the first semiconductor chip;
   a digital circuit formed on the first semiconductor chip; and
   a second semiconductor chip comprising a dummy chip attached to the first semiconductor chip with an adhesive so as to cover the analog circuit completely and not to cover part of the digital circuit.

8. The multi-chip package of claim 7, wherein the second semiconductor chip comprises a substrate having the same material composition as the first semiconductor chip.

9. The multi-chip package of claim 1, wherein the second semiconductor chip covers no part of the digital circuit or the nonvolatile register.

10. The multi-chip package of claim 1, wherein the second semiconductor chip covers no part of the digital circuit.

* * * * *